(12) United States Patent
Satoh

(10) Patent No.: US 7,787,097 B2
(45) Date of Patent: Aug. 31, 2010

(54) FLEXIBLE BASE MATERIAL AND FLEXIBLE IMAGE-DISPLAYING DEVICE RESISTANT TO PLASTIC DEFORMATION

(75) Inventor: Tasuku Satoh, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 176 days.

(21) Appl. No.: 11/791,232

(22) PCT Filed: Feb. 22, 2005

(86) PCT No.: PCT/JP2005/002800

§ 371 (c)(1),
(2), (4) Date: May 22, 2007

(87) PCT Pub. No.: WO2006/090434

PCT Pub. Date: Aug. 31, 2006

(65) Prior Publication Data

US 2008/0055831 A1 Mar. 6, 2008

(51) Int. Cl.
*G02F 1/1333* (2006.01)
*G09G 3/00* (2006.01)

(52) U.S. Cl. .................. 349/158; 361/618; 428/141

(58) Field of Classification Search .............. None
See application file for complete search history.

(56) References Cited

U.S. PATENT DOCUMENTS 6,069,740 A * 5/2000 Hamanaka ................. 359/620

2003/0213956 A1 * 11/2003 Hioki et al. ................. 257/59

FOREIGN PATENT DOCUMENTS

| JP | 57-38131 | | 3/1982 |
|---|---|---|---|
| JP | 57-123057 | A | 7/1982 |
| JP | 60-119850 | A | 6/1985 |
| JP | 60-254077 | A | 12/1985 |
| JP | 4-22075 | A | 1/1992 |
| JP | 7-1424 | U | 1/1995 |
| JP | 10-82993 | A | 3/1998 |
| JP | 11-271794 | A | 10/1999 |
| JP | 2002-278466 | A | 9/2002 |
| JP | 2004-77784 | A | 3/2004 |
| JP | 2004-101976 | A | 4/2004 |
| WO | WO-2004/047059 | A1 | 6/2004 |

* cited by examiner

*Primary Examiner*—Tina M Wong
(74) *Attorney, Agent, or Firm*—Birch, Stewart, Kolasch & Birch, LLP

(57) ABSTRACT

An anti-deformation structure is formed on the surface of a flexible plate-shaped part. The anti-deformation structure includes protrusions and depressions formed on the surface of the plate-shaped part. The protrusions and depressions has a shape in which adjacent protrusions become in contact with each other in the state when the plate-shaped part is deformed within a range of elastic deformation, restricting further greater deformation, and thus, preventing excessive deformation leading to permanent deformation and raising the resistance to the stress. The flexible base material can be applied to flexible image-displaying devices.

15 Claims, 17 Drawing Sheets

FLEXIBLE BASE MATERIAL AND FLEXIBLE IMAGE-DISPLAYING DEVICE RESISTANT TO PLASTIC DEFORMATION

TECHNICAL FIELD

The present invention relates to a flexible base material and a flexible image-displaying device, and in particular, to a flexible base material and a flexible image-displaying device resistant to plastic deformation.

BACKGROUND ART

As the realization of an ubiquitous society approaches, there are great hopes for the development of wearable display devices. A wearable display device is a flexible device consisting of a flexible substrate and a display element formed thereon. Examples of such display devices include liquid crystal display elements, organic electroluminescent (organic EL) elements, and paper-like displays (electronic paper).

For example, a polymeric material such as polyimide has been used for the flexible substrate. Such substrates can be bent within a range of elastic deformation without generating plastic deformation (permanent deformation) up to a curvature radius of about several mm. However, bending beyond a range of elastic deformation leads to permanent deformation, which in turn causes whitening of the deformed members.

For example, an inorganic insulating film and an indium tin oxide (ITO) electrode have been used in many flexible display devices. Alternatively, a thin-film transistor is formed on a flexible substrate in active-display devices. Thus, bending of a flexible display device beyond a particular curvature radius leads to breakdown of the insulating film and the electrode.

The following Patent Document 1 discloses a flexible thin-film circuit board highly resistant to bending stress. In the thin-film circuit board disclosed in Patent Document 1, an inorganic insulating film in an island pattern is disposed over the electronic element such as of thin film transistor. The inorganic insulating film and wiring are covered with a resin film additionally.

The inorganic insulating film higher in rigidity than the organic insulating films protects the electronic element by covering the electronic element. When bending stress is applied to the thin-film circuit board, the substrate and the resin film can be bent together according to the bending stress applied, because the inorganic insulating film is patterned in an island structure.

The invention disclosed in Patent Document 1 allows protection of the electronic element from bending stress, but the region where no electronic element is formed may be bent beyond the elastic deformation range. The bending members cause permanent deformation and whitening of the flexible substrate. For that reason, the operator should be careful enough in handling the flexible base material not to generate permanent deformation by bending.

An object of the present invention is to provide a flexible base material highly resistant to excessive deformation and stress that may cause permanent deformation, and a flexible image-displaying device using the same.

[Patent Document 1]
JP-A No. 2004-101976

DISCLOSURE OF THE INVENTION

According to an aspect of the present invention, there is provided a flexible base material, comprising a flexible plate-shaped part and an anti-deformation structure formed on the surface of the plate-shaped part, wherein the anti-deformation structure includes protrusions and depressions on the surface of the plate-shaped part and the protrusions and depressions are shaped such that the adjacent protrusions come into contact with each other when the plate-shaped part is bent within a range of elastic deformation and restrict further deformation.

Another aspect of the present invention provides a flexible image-displaying device, comprising an image-displaying plate having multiple pixels formed on the surface of a flexible film and a flexible base material attached to the image-displaying plate that deforms together with the image-displaying plate, wherein the flexible base material further comprises a flexible plate-shaped part and an anti-deformation structure formed on the surface of the plate-shaped part, the anti-deformation structure includes protrusions and depressions formed on the surface of the plate-shaped part, and the protrusions and depressions is are shaped such that adjacent protrusions come into contact with each other when the plate-shaped part is bent within a range of elastic deformation and restrict further deformation.

The contact between adjacent protrusions restricts further deformation and prevents breakdown of the plate-shaped part or the image-displaying plate by deformation.

BEST MODE OF CARRYING OUT THE INVENTION

Figure 1A:
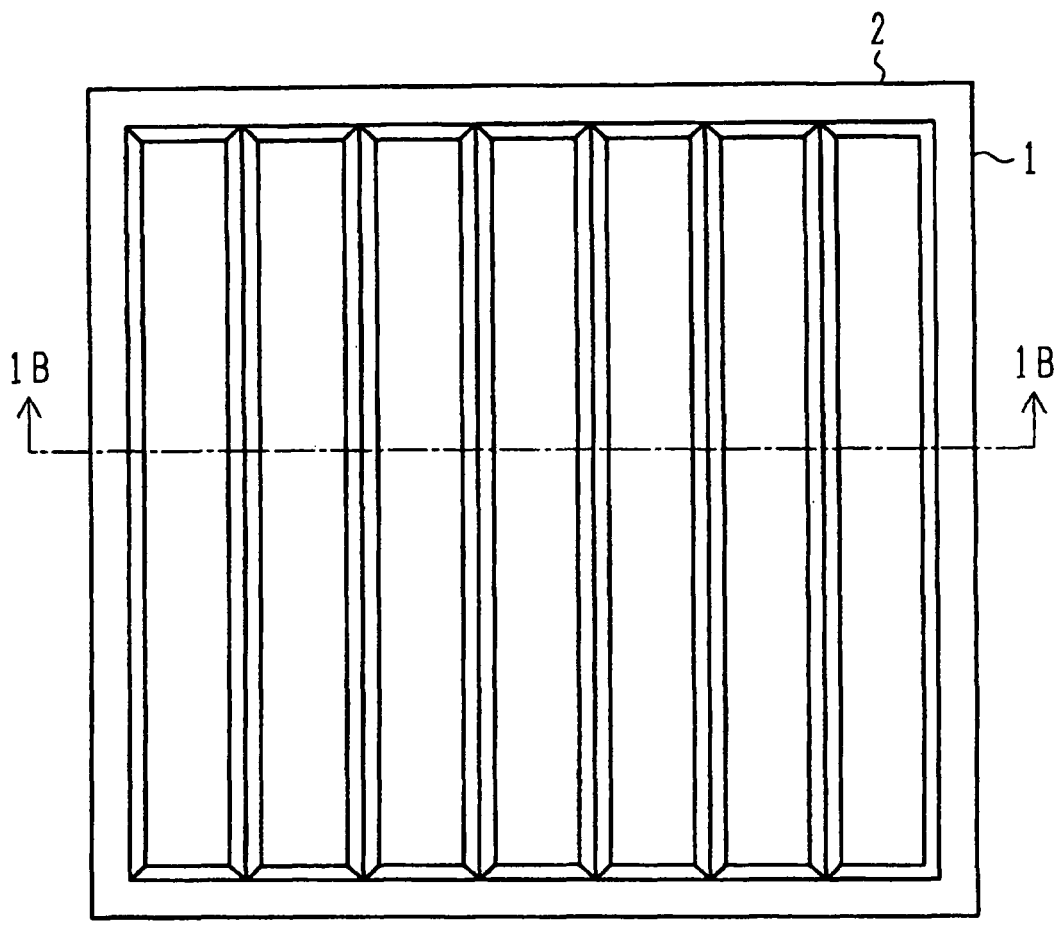
FIG. 1A is a top view illustrating the flexible base material in a first embodiment.
Figure 1B:
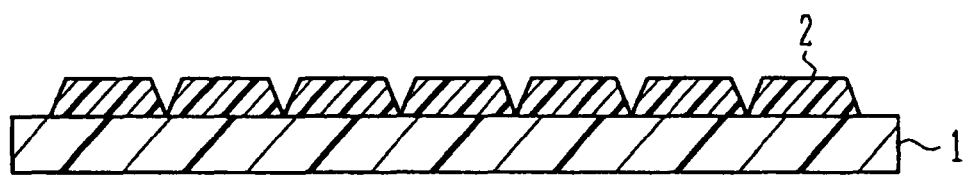
FIG. 1B is a sectional view of the flexible base material in the first embodiment.

FIG. 1A is a top view illustrating the flexible base material in a first exemplary embodiment, and FIG. 1B is a sectional view illustrating the flexible base material along the alternate long and short dash line 1B-1B in FIG. 1A. An anti-deformation structure of multiple protrusions 2 is formed on one surface of a flexible plate-shaped part 1. Each protrusions 2 has a long belt shape extending in one direction, and the longitudinal directions of the multiple protrusions 2 are disposed in parallel with each other (vertical direction in FIG. 1A). The cross section (in the width direction) of each protrusion 2 is trapezoidal, as seen from the longitudinal direction. Two adjacent protrusions 2 are connected to each other at the edges of the bottom faces in the longitudinal direction.

The plate-shaped part 1 is made, for example, of polyimide, and the protrusion 2 is made of a material, for example polycarbonate, higher in rigidity than the plate-shaped part 1. The planar shape of the plate-shaped part 1 is, for example, rectangular of 5 cm×4 cm in size, and the thickness is, for example, 200 μm. The bottom face of each protrusion 2 has, for example, a width of 1 mm and a thickness of 150 μm. The length of the protrusion 2 is close to the length from one side to the opposing side of the plate-shaped part 1. The protrusion 2 is bonded to the plate-shaped part 1 with a UV-hardening adhesive.

Figure 1C:
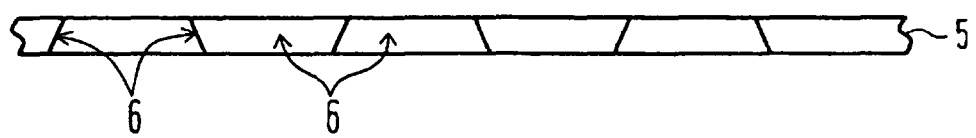
FIG. 1C is a sectional view of the film for preparation of the protrusions in the flexible base material of the first exemplary embodiment.

An example of the method of forming the protrusion 2 will be described below with reference to FIG. 1C. A polycarbonate sheet 5 having a thickness of 150 μm is used. FIG. 1C is a sectional view illustrating the polycarbonate sheet. The cutting plane 6 of the polycarbonate sheet 5 is cut with a metal blade, to give multiple stripe-shaped protrusions 2. The metal blade is so tilted during cutting that the angle between the surface of the polycarbonate sheet 5 and the cutting plane 6 becomes, for example, 80°. The protrusions 2 having trapezoidal cross section are obtained by changing the inclination angle of the cutting plane 6 alternately.

A UV-hardening adhesive is applied on one surface of the plate-shaped part 1, and the protrusions 2 are disposed aligned on the adhesive layer. Irradiation of the adhesive layer with ultraviolet ray causes hardening of the adhesive, resulting in adhesion of the protrusion 2 on the plate-shaped part 1.

Hereinafter, the resistance to bending stress of the flexible base material shown in FIG. 1 will be described with reference to FIG. 2.

Figure 2:
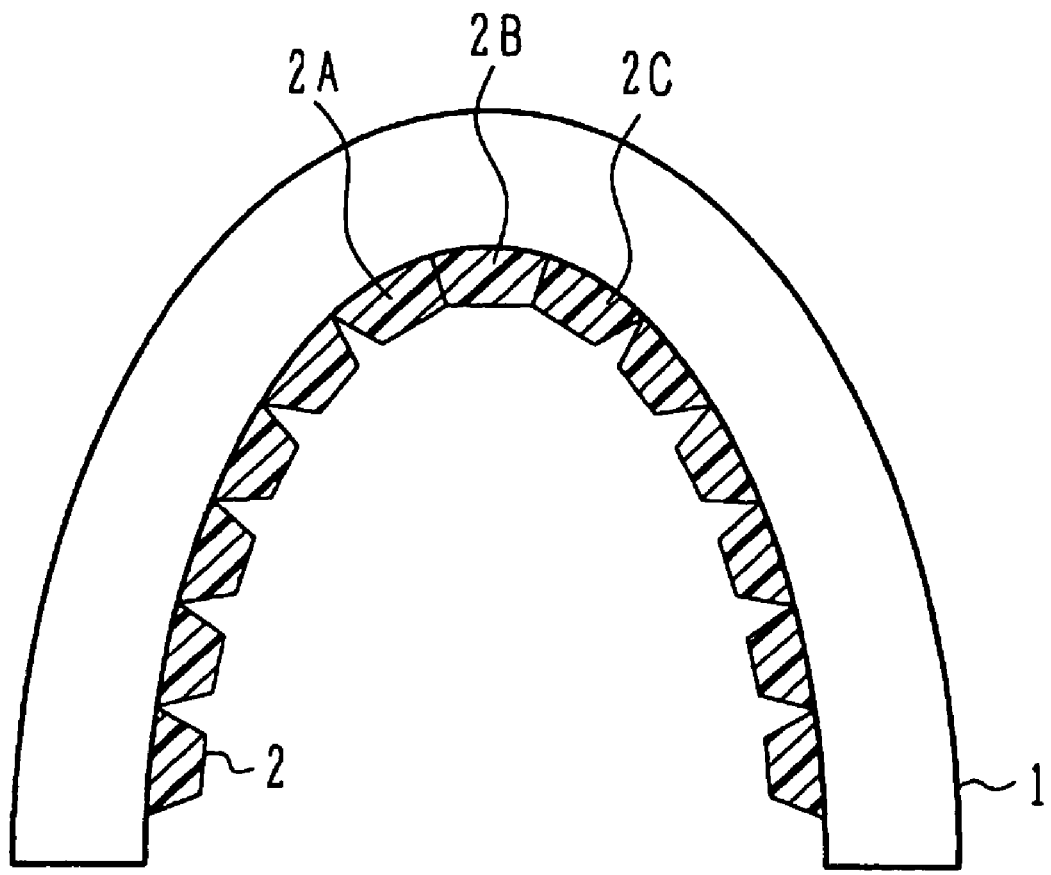
FIG. 2 is a sectional view illustrating the flexible base material in the first exemplary embodiment when deformed.

FIG. 2 is a sectional view illustrating the flexible base material shown in FIG. 1 when it is bent with the face carrying the protrusion 2 disposed inside. When the curvature (deformation) reaches a particular point, the side walls of two adjacent protrusions 2A and 2B, or 2B and 2C, come into contact with each other.

The plate-shaped part 1 relatively lower in rigidity id deformed preferentially and bent by a smaller force until the side walls of the two adjacent protrusions 2 become in contact. Because the protrusions 2 is made of a material higher in rigidity than the plate-shaped part 1, the plate-shaped part 1 is not deformed any more when the side walls of the adjacent protrusions 2 come into contact with each other. In such a case, the first exemplary embodiment, the plate-shaped part 1 is deformed easily to an inner-surface curvature radius of 4 mm, but further deformation is prohibited.

The cross sectional shape of the protrusions 2 is so designed that the plate-shaped part 1 is deformed only within a range of elastic deformation or that the side walls of the adjacent protrusions 2 come into contact with each other before permanent deformation occurs. For that reason, the plate-shaped part 1 is restricted permanent deformation by the protrusion 2. Contact of the protrusions 2, which causes distinctive increase in the force needed for bending the plate-shaped part 1, enables those who handle the flexible base material to detect the limit of bending in the elastic deformation sensuously and easily.

In the first exemplary embodiment above, shown are a plate-shaped part 1 made of polyimide and protrusions 2 of polycarbonate, but the materials for the plate-shaped part 1 and for the protrusion 2 are not limited thereto. Any other material which can be ensure the plate-shaped part 1 with flexibility may be used for the plate-shaped part 1. In the present description, the term "flexible" means that the material can be bent or deformed by human hands. The material for the protrusion 2 is preferably a material having a higher rigidity than that of the plate-shaped part 1. If light transparency is not demanded, the protrusion 2 may be made of metal.

The material for the protrusion 2 may be a material having rigidity almost similar to that of the plate-shaped part 1. In such a case, the contact between two adjacent protrusions 2 gives a bending resistance similar to that when the plate-shaped part 1 is thickened. The thin plate-shaped part 1 can be deformed relatively easily until the contact between adjacent protrusions 2.

Figure 3A:
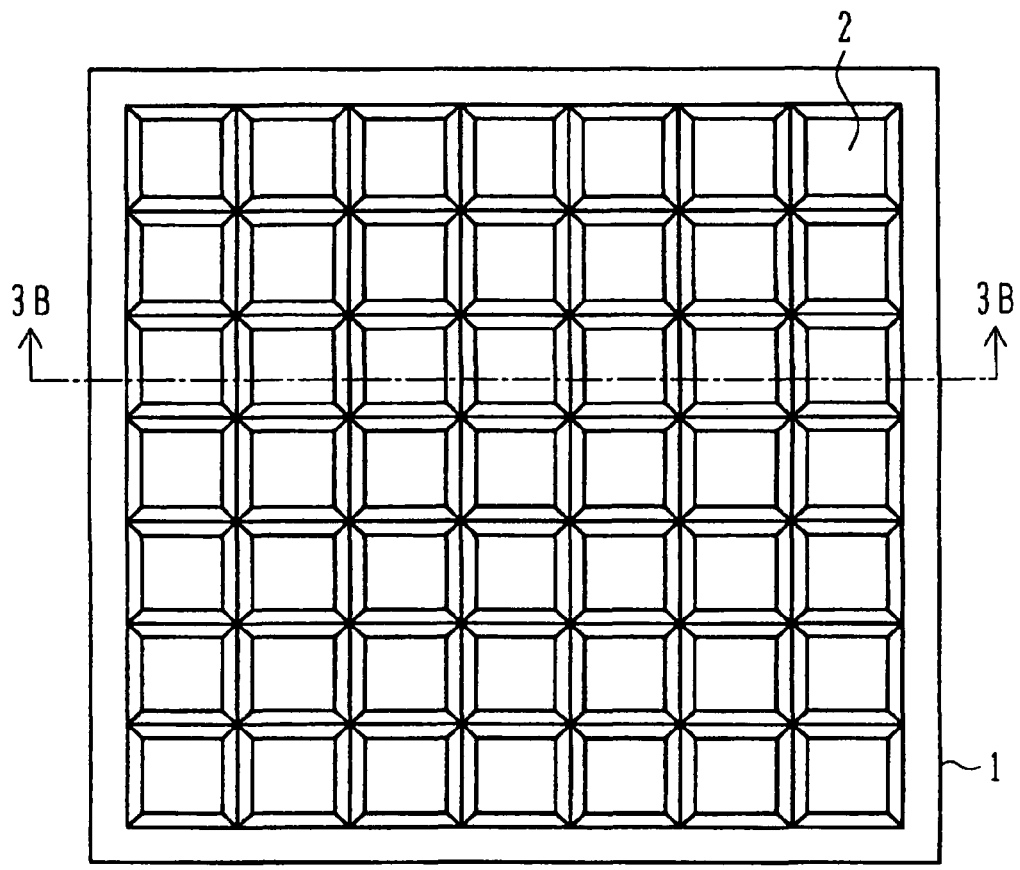
FIG. 3A is a top view illustrating the flexible base material in a second embodiment.
Figure 3B:
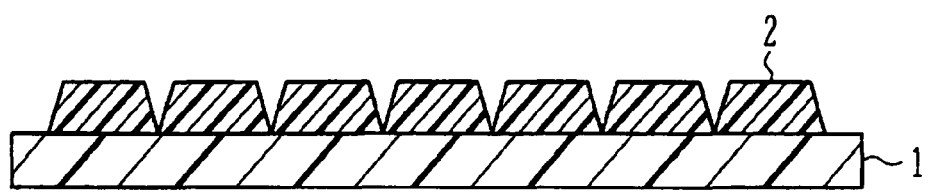
FIG. 3B is a sectional view illustrating the flexible base material in the second exemplary embodiment.

FIG. 3A is a top view illustrating the flexible base material in a second exemplary embodiment, and FIG. 3B is a sectional view of the base material in FIG. 3A, as seen along the chained line 3B-3B. In the first exemplary embodiment shown in FIGS. 1A and 1B, each protrusion 2 had a belt-shaped planar shape extending in one direction, but, in the second exemplary embodiment, each protrusion 2 is square in planar shape. Multiple protrusions 2 square in planar shape are disposed in the matrix form. The three-dimensional shape of each protrusion 2 is pyramidal trapezoid. The bottom face is, for example, square at 1 mm in side length, and, for example, the angle between the slant face and the bottom face is 80° and the height is 150 μm. The shape of the cross section perpendicular to the bottom face is trapezoidal and the same as the cross-sectional shape of the protrusion 2 in the first exemplary embodiment.

Because the protrusion 2 in the first exemplary embodiment has a planar shape extending in one direction, the flexible base material is easily bent in the width direction of the protrusion 2 (direction in which the cross section perpendicular to the longitudinal direction is bent), but is resistant to bending in the longitudinal direction (direction in which the cross section parallel with the longitudinal direction is bent). In the second exemplary embodiment, in which the planar shape of each protrusion 2 is square, the flexible base material may be bent in any direction, either in the row or column direction, of the protrusion 2 arranged.

Figure 4A:
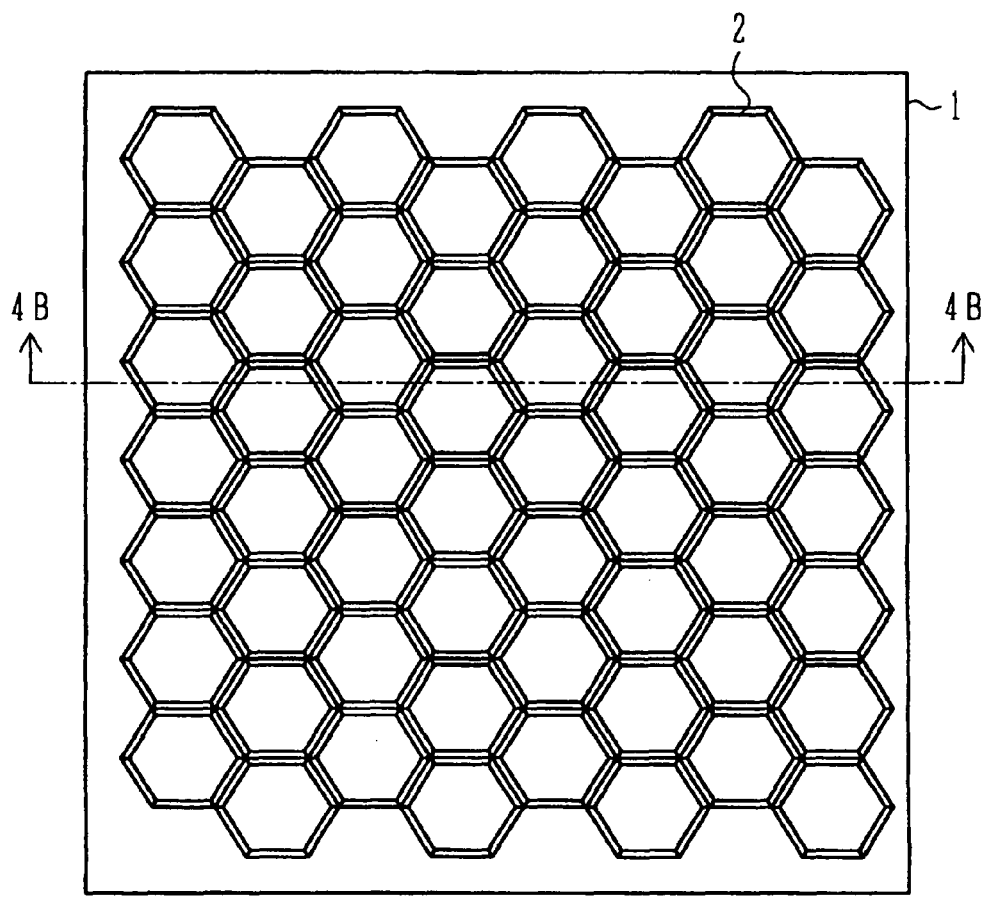
FIG. 4A is a top view illustrating the flexible base material in a third exemplary embodiment.
Figure 4B:
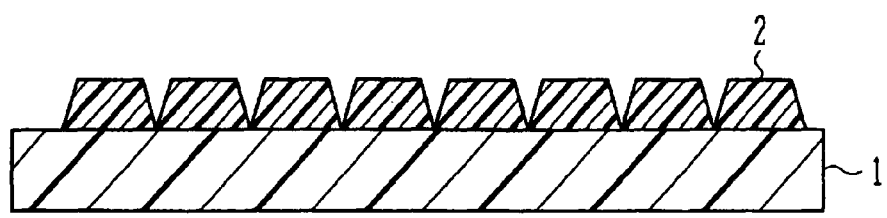
FIG. 4B is a sectional view illustrating the flexible base material in the third exemplary embodiment.

FIG. 4A is a top view illustrating the flexible base material in a third exemplary embodiment, and FIG. 4B is a sectional view of it in FIG. 4A, as seen along the chained line 4B-4B. In the third exemplary embodiment, the planar shape of the protrusion 2 is equilateral hexagonal. Multiple protrusions 2 equilateral hexagonal in planar shape are disposed in the honeycomb structure, and the entire surface is covered with the protrusions 2. The three-dimensional shape of each protrusion 2 is hexagonal pyramidal trapezoid. For example, the length of the side of bottom face is 0.5 mm; the angle between the bottom face and the slant face is 80°; and the height is 150 μm. The shape of the cross section perpendicular to the bottom face is trapezoidal and the same as the cross-sectional shape of the protrusion 2 in the first exemplary embodiment.

Because the planar shape of the protrusion 2 in the third exemplary embodiment is equilateral hexagonal, the flexible base material is easily bent in three directions parallel with the respective sides of the hexagon.

Figure 5A:
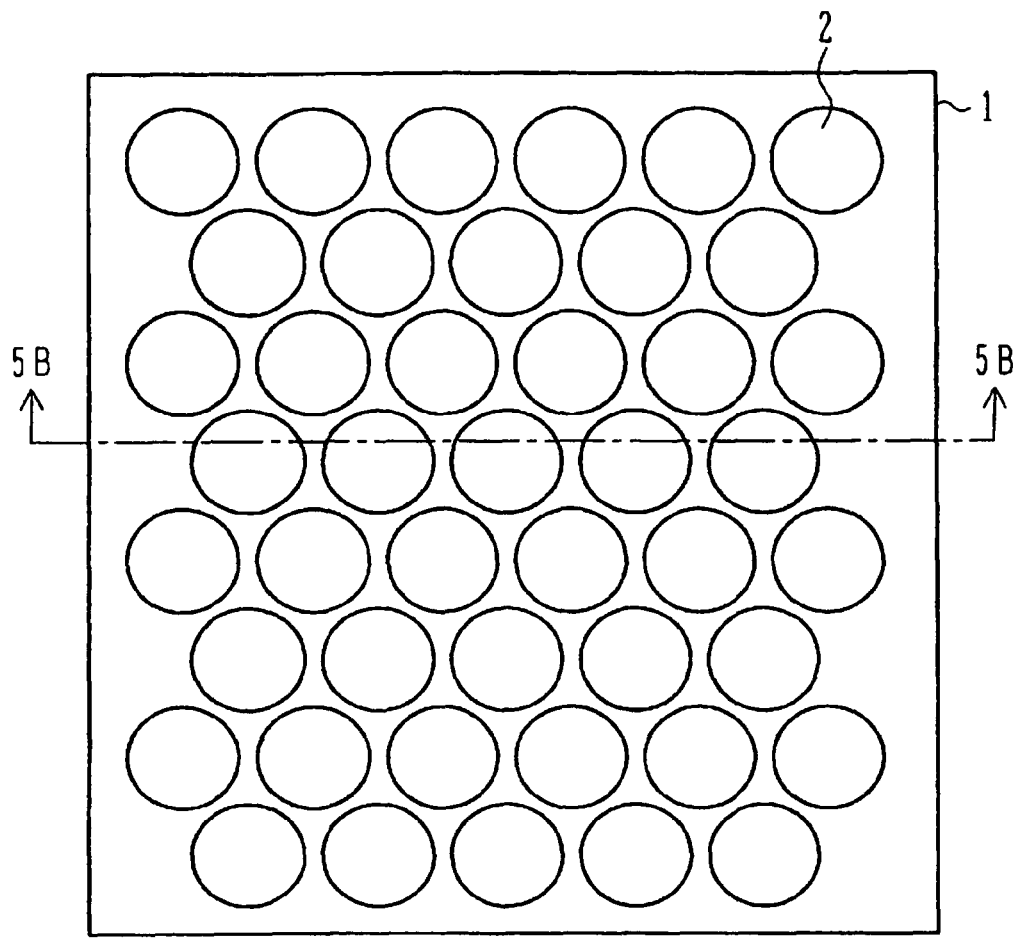
FIG. 5A is a top view illustrating the flexible base material in a fourth exemplary embodiment.
Figure 5B:
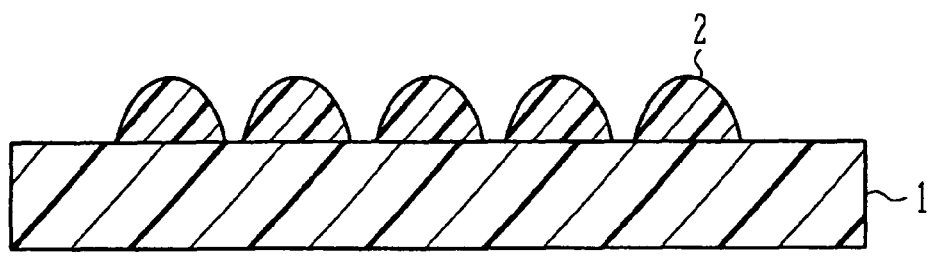
FIG. 5B is a sectional view illustrating the flexible base material in the fourth exemplary embodiment.

FIG. 5A is a top view illustrating the flexible base material in a fourth exemplary embodiment, and FIG. 5B is a sectional view of it in FIG. 5A, as seen along the chained line 5B-5B. In the fourth exemplary embodiment, the planar shape of the protrusion 2 is circular. Multiple protrusions 2 circular in planar shape are arranged at positions of the lattice points of a triangular lattice. Each protrusion 2 has a three-dimensional shape with a rounded top and a smooth-surfaced slant face. For example, it has a semi-spherical or semi-spheroidal three-dimensional shape.

When the slant face of the protrusion 2 is flat as in the first to third exemplary embodiments, the slant faces of two adjacent protrusions 2 become in contact almost over the entire surface thereof when the flexible base material is bent. Because the slant face of the protrusion 2 is curved in the fourth exemplary embodiment, the slant faces of two adjacent protrusions 2 come into contact only partially when the flexible base material is bent. It is possible to prevent excessive curvature, even when the protrusions 2 come into contact partially.

In contrast to in the first to third exemplary embodiments, the direction of bending is not limited to particular directions in the fourth exemplary embodiment. The protrusions 2 may be distributed randomly. In such a case, easy bending direction is not limited to particular directions, and thus, it is possible to obtain a flexible base material that can be bent, independently of the direction.

Figure 6A:
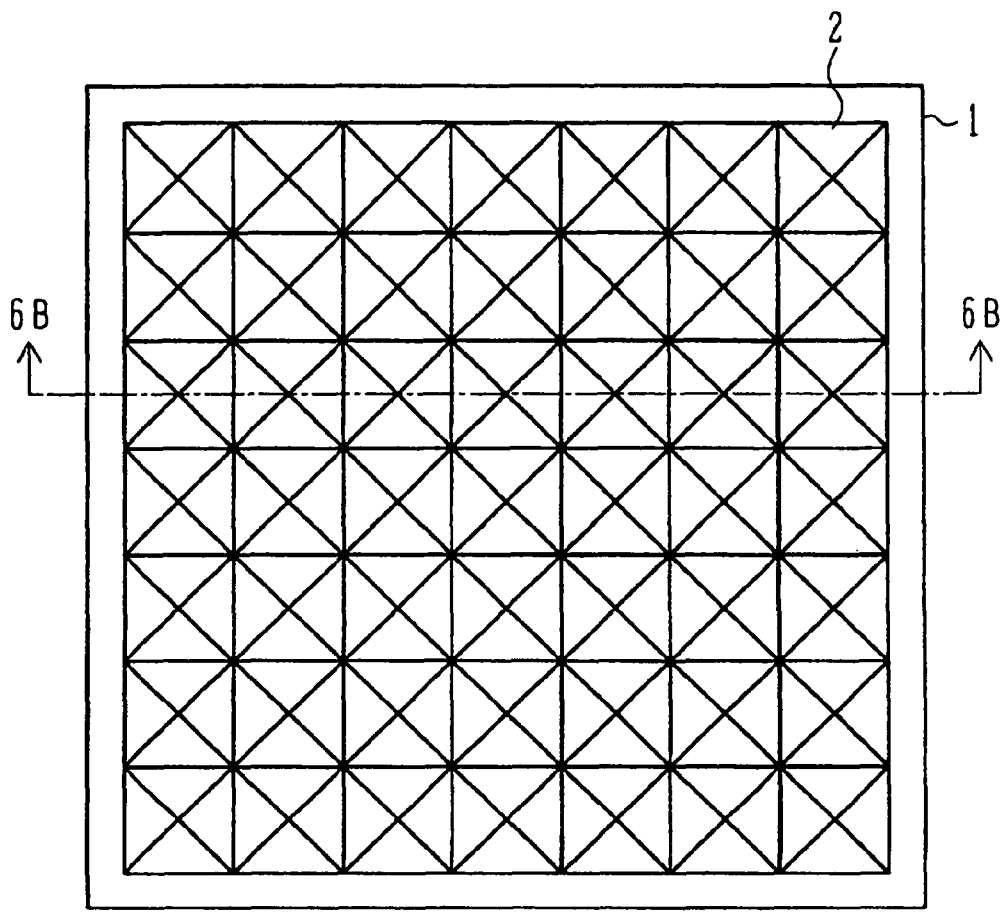
FIG. 6A is a top view illustrating the flexible base material in a fifth exemplary embodiment.
Figure 6B:
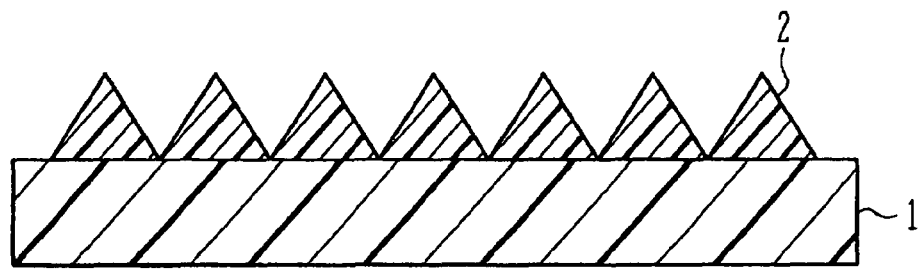
FIG. 6B is a sectional view illustrating the flexible base material in the fifth exemplary embodiment.

FIG. 6A is a top view illustrating the flexible base material in a fifth exemplary embodiment, and FIG. 6B is a sectional view of it in FIG. 6A, as seen along the chained line 6B-6B. In the fifth exemplary embodiment, the protrusion 2 has a square planar shape and a pyramidal trapezoidal three-dimensional shape. The protrusions 2 are arranged in the matrix form. For example, the bottom face is square at 1 mm in side length, and the angle between the bottom face and the slant face is 80°.

When the plate-shaped substrate 1 is bent, the area of the slant faces of adjacent protrusions 2 in contact with each other is greater in the fifth exemplary embodiment than in the second exemplary embodiment shown in FIGS. 3A and 3B. Thus, it is possible to raise the resistance to the stress in a direction of bending.

The protrusions 2 on the flexible base material in any one of the second to fifth exemplary embodiments may be formed, for example, by using an injection-molding machine. For prevention of separation of the multiple protrusions 2, the protrusions 2 may be formed as connected to each other with a film sufficiently thinner than the plate-shaped part 1. The structure of protrusion 2 resistant to separation makes it easier to bond the multiple protrusions 2.

If the plate-shaped part 1 and the protrusion 2 are made of the same material, they may be formed by integral molding. The three-dimensional shape of the protrusion 2 may be changed to a more widely-used shape such as pyramidal, pyramidal trapezoidal, conic, or conic trapezoidal shapes.

Figure 7:
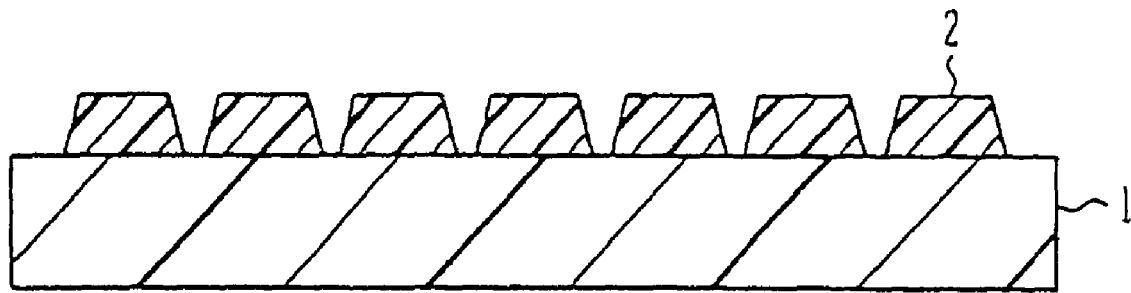
FIG. 7 is a sectional view illustrating the flexible base material in a sixth exemplary embodiment.

FIG. 7 is a sectional view illustrating the flexible base material in a sixth exemplary embodiment. Its planar shape may be any one of the planar shapes of the flexible base materials in the first to fourth exemplary embodiments. In the first to third exemplary embodiments, the adjacent protrusions 2 are so disposed that they come into contact with each other at the edges on the bottom face. In the sixth exemplary embodiment, adjacent protrusions 2 are separated from each other by a certain distance. The adjacent protrusions 2 may be separated from each other at a certain distance, if the contact between two adjacent protrusions 2 can prevent excessive deformation when the plate-shaped part 1 is deformed in a range of its elastic deformation.

Figure 8:
FIG. 8 is a sectional view illustrating the flexible base material in the seventh exemplary embodiment.

FIG. 8 is a sectional view illustrating the flexible base material in a seventh exemplary embodiment. The flexible base material in the present exemplary embodiment has multiple grooves 3 having a V-shaped cross section formed on the surface of the flexible plate-shaped part 1. When multiple grooves 3 are formed in parallel with each other, the regions between the grooves 3 exert an action similar to that of the protrusions 2 in the first exemplary embodiment shown in FIGS. 1A and 1B. When the grooves 3 are formed in a square lattice shape, the regions between the grooves 3 exert an action similar to that of the protrusions 2 in the second exemplary embodiment shown in FIGS. 3A and 3B. More generally, multiple grooves in a direction parallel to a first direction and multiple grooves in a direction parallel to a second direction that is perpendicular to the first direction, may be formed. The cross section of the groove 3 may not be V-shaped, and may be in any other shape, for example, U shape.

Figure 9:
FIG. 9 is a sectional view illustrating the flexible base material in an eighth exemplary embodiment.

FIG. 9 is a sectional view illustrating the flexible base material in an eighth exemplary embodiment. In the eighth exemplary embodiment, multiple almost hemispherical depressions 4 are formed on the surface of the plate-shaped part 1. The depressions 4 are located randomly or at the positions of the lattice points, for example, of a square or triangular lattice on the surface of the plate-shaped part 1. The region where no depression 4 is formed (area of the plate-shaped part 1 having its original thickness) exerts an action similar to that of the protrusions 2 in the first to sixth exemplary embodiments.

Hereinafter, the flexible image-displaying device in a ninth exemplary embodiment will be described, with reference to FIGS. 10A and 10B. The flexible image-displaying device in the ninth exemplary embodiment is a flexible image-displaying plate, applied the flexible base material in the first to eighth exemplary embodiments to an electrophoretic paper-like display, for example.

Figure 10A:
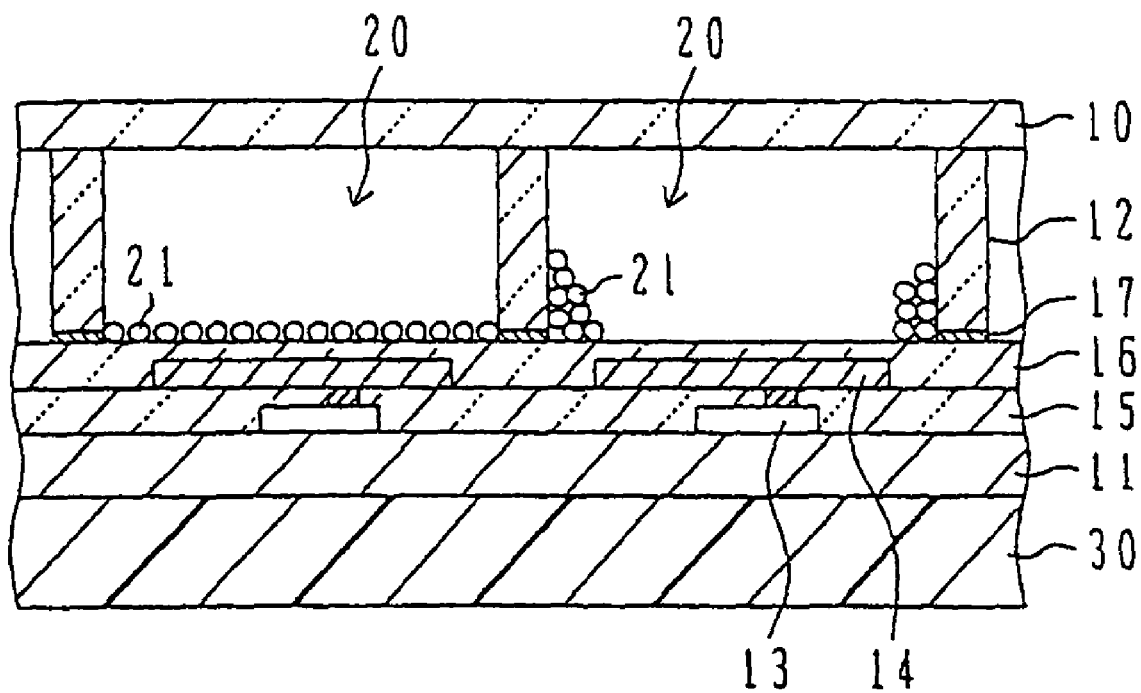
FIG. 10A is a sectional view illustrating a two-pixel region in the flexible image-displaying device of a ninth exemplary embodiment.
Figure 10B:
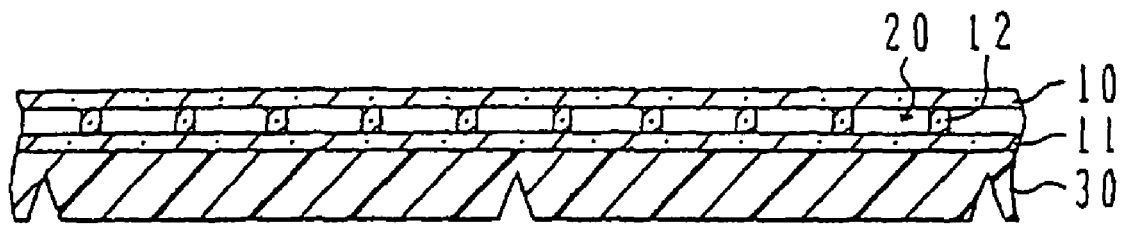
FIG. 10B is a sectional view illustrating a multiple-pixel region in the flexible image-displaying device of the ninth exemplary embodiment.

FIG. 10A is a sectional 1 view illustrating the cross section of the two-pixel region in the flexible image-displaying device of the ninth exemplary embodiment, and FIG. 10B is a sectional view of the cross section of the multiple-pixel region. A switching element 13 such as of thin film transistor is formed to each pixel on the surface of a rear substrate 11. An interlayer insulating film 15 is formed over the rear substrate 11, covering the switching elements 13. A first electrode 14 corresponding to the pixel is formed on the interlayer insulating film 15. The first electrode 14 is connected to the corresponding switching element 13, through a via hole penetrating the interlayer insulating film 15. An inorganic insulating film 16, for example of silicon nitride, is formed, covering the first electrode 14.

A display-sided substrate 10 is disposed, as it is separated from the insulating film 16. Barrier walls 12 are formed between the display-sided substrate 10 and the insulating film 16. The barrier walls 12, which are disposed in the lattice form on the insulating film 16, partition pixels and ensure separation of the display-sided substrate 10 from the insulating film 16 by a certain distance.

A second electrode 17 for example of aluminum is disposed between the barrier wall 12 and the insulating film 16. The second electrode 17 may be embedded, for example, inside the barrier 12. An insulative liquid 20 such as of silicon oil is filled in the space surrounded by the insulating film 16, display-sided substrate 10, and barrier 12. Multiple electrophoretic particles 21 having a particle diameter of about 1 to 2 μm are dispersed in the insulative liquid 20. Examples of the materials for the electrophoretic particles 21 include carbon black-containing polystyrene-polymethyl methacrylate copolymer resins, and the like.

Thus, a paper-like display held between the rear substrate 11 and the display-sided substrate 10 is formed. The paper-like display is disclosed, for example, in JP-A No. 2003-161966.

A flexible base material 30 is bonded onto the external surface of the rear substrate 11. The flexible base material 30 is the same as the flexible base material in any one of the first to eighth exemplary embodiments described above. Multiple pixels are located in one protrusion on the flexible base material 30 in the in-plane direction.

Hereinafter, operation of the flexible image-displaying device in the ninth exemplary embodiment will be described. The second electrode 17 is grounded. It is assumed that the electrophoretic particle 21 is charged positively. When a positive voltage is applied to the first electrode 14, the electrophoretic particles 21 gather in a region close to the second electrode 17, as shown in the pixel in the right of FIG. 10A. When the surface of the first electrode 14 is white in color, the pixel enters into a white-displaying state. When a negative voltage is applied to the first electrode 14, the electrophoretic particles 21 spread over the first electrode 16, as shown in the pixel in the left of FIG. 10A. Accordingly, the pixel enters into a state showing black electrophoretic particles 21.

Figure 10C:
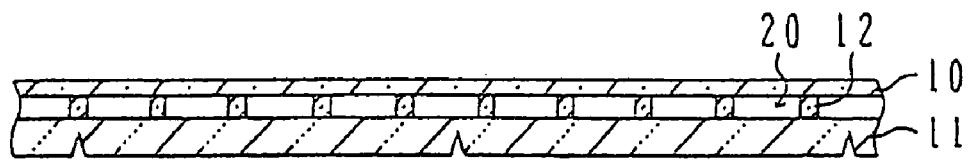
FIG. 10C is a sectional view illustrating a multiple-pixel region in the flexible image-displaying device in a modification of a ninth exemplary embodiment.

The flexible base material 30 restricts the degree of curvature (deformation) when the flexible image-displaying device is bent with the rear substrate 11 inside, and prevents breakdown of the paper-like display. Although a flexible part 30 is bonded onto the surface of the rear substrate 11 in the ninth exemplary embodiment, it is possible to make the rear substrate doubles as the flexible base material 30, as shown in FIG. 10C, by forming protrusions and depressions on the surface of the rear substrate 11.

Figure 10D:
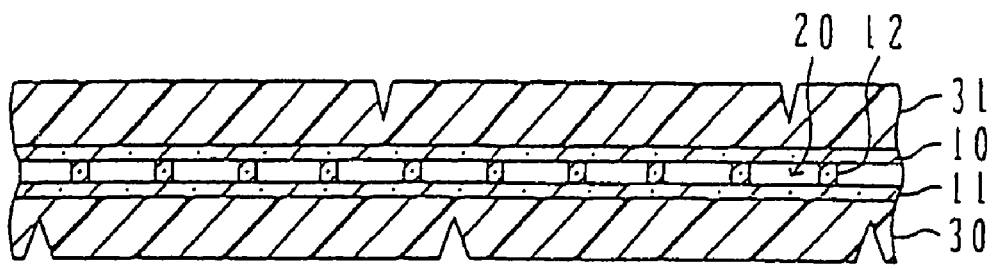
FIG. 10D is a sectional view illustrating a multiple-pixel region in the flexible image-displaying device in another modification of the ninth exemplary embodiment.

Alternatively as shown in FIG. 10D, a flexible base material 31 may be bonded additionally on the external surface of the other substrate 10. In such a case, anti-deformation structures are present on both faces of the paper-like display, and also prevent curvature in the direction with the substrate 10 bent inward. There is no need for adjustment in location of the protrusions and depressions on one flexible base material 30 with that of the other flexible base material 31.

Figure 10E:
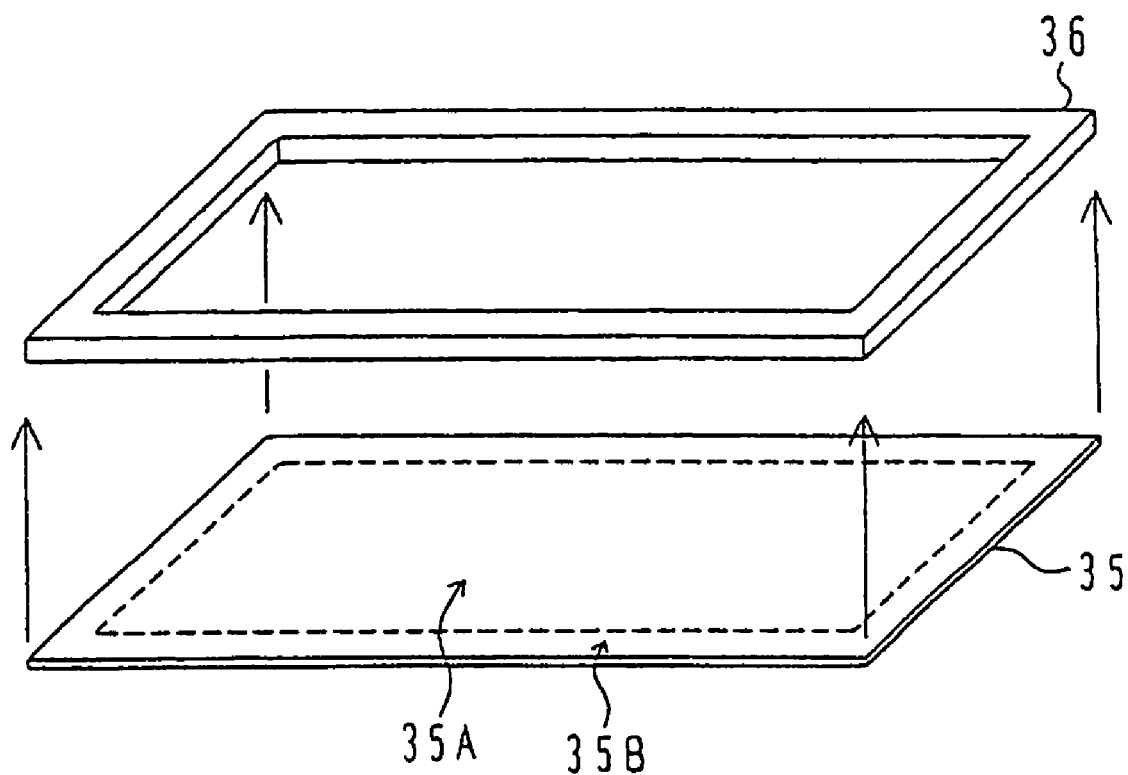
FIG. 10E is an exploded perspective view illustrating the flexible image-displaying device in further another modification of the ninth exemplary embodiment.

FIG. 10E is an exploded perspective view illustrating the flexible image-displaying device in modification of the ninth exemplary embodiment. There are an image-displaying region 35A displaying an image and a frame region 35B surrounding the image-displaying region 35A formed on the paper-like display 35. The frame region 35B is bonded to a frame 36. The image-displaying region 35A does not overlap the frame 36. Thus, the image-displaying region 35A is seen visually without interruption by the frame 36. An protrusions and depressions for prevention of curvature (anti-deformation structure) is formed on one or both faces of the frame 36, similarly to the flexible base material in any one of the first to eighth exemplary embodiments. Bending of the paper-like display 35 is accompanied with bending of the frame 36. Prevention of excessive deformation of the frame 36 results in prevention of breakdown of the paper-like display 35.

Figure 10F:
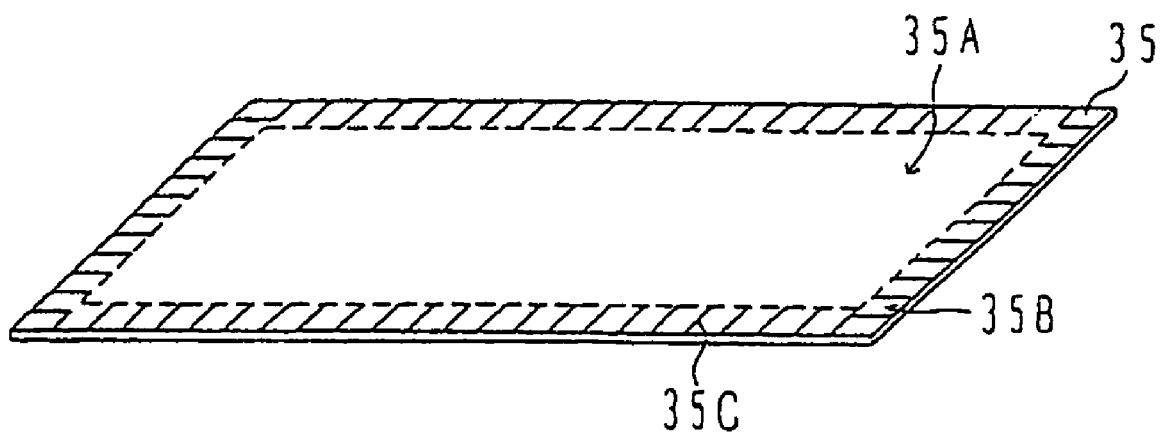
FIG. 10F is a perspective view illustrating the flexible image-displaying device having an anti-deformation structure directly formed in the frame region.

As shown in FIG. 10F, the anti-deformation structure 35C may be connected directly to the frame region 35B. For example, the frame region 35B is divided into four regions along the four sides of the image-displaying region 35A. An anti-deformation structure 35C with protrusions or depressions extending in the width direction is formed in each of the four regions. Because there is no protrusions and depressions in the image-displaying region 35A, the image thereon can be seen visually from both faces without interruption by the protrusions and depressions.

The paper-like display is a generic term for thin displays such as paper, and examples thereof so far proposed include horizontally-transporting electrophoretic displays transporting charged particles in the horizontal direction (in-plane direction) such as the flexible image-displaying device in the ninth embodiment, and other various systems. Examples of the other systems include microcapsular electrophoretic displays, twisting-pole displays, electric field precipitation displays, melting displays, and the like. The flexible base materials in the first to eighth exemplary embodiments can be applied to these various paper-like displays.

Figure 11A:
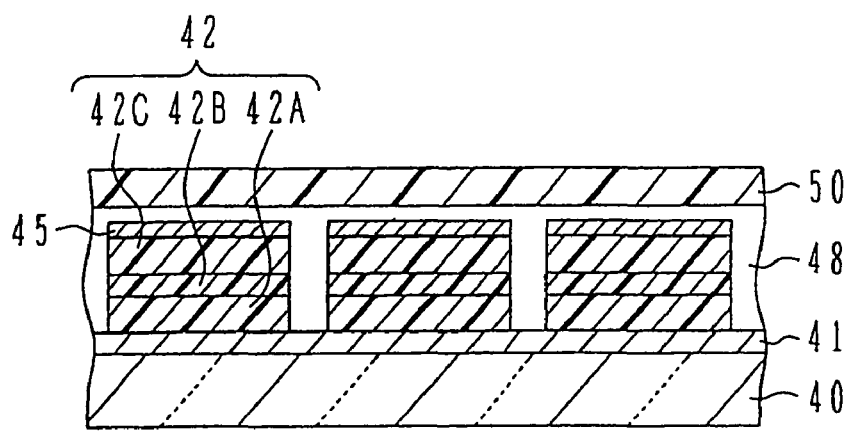
FIG. 11A is a sectional view illustrating a three-pixel region in the flexible image-displaying device of a tenth exemplary embodiment.

Hereinafter, the flexible image-displaying device in the first exemplary embodiment will be described with reference to FIGS. 11A and 11B. In the flexible image-displaying device in the first exemplary embodiment, one of the flexible base materials in the first to eighth exemplary embodiments is applied to the flexible image-displaying plate, for example to the organic EL element.

Figure 11B:
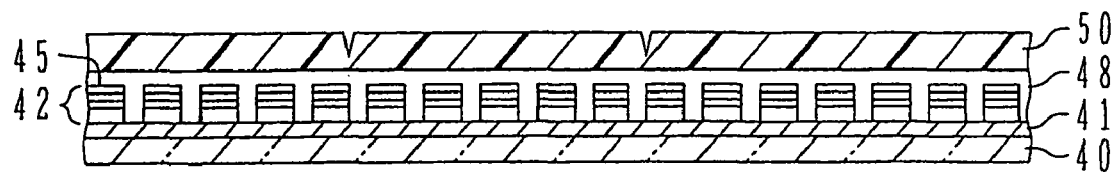
FIG. 11B is a sectional view illustrating a multiple-pixel region in the flexible image-displaying device of the tenth exemplary embodiment.

FIG. 1A is a sectional view illustrating a three-pixel region of the flexible image-displaying device in the first exemplary embodiment, and FIG. 11B is a sectional view of a multiple-pixel region. Multiple positive electrodes 41 of ITO are formed on the surface of a flexible transparent film 40. The positive electrodes 41 are disposed at positions parallel with each other (crosswise direction in FIG. 11A) on the surface of the transparent film 40.

Multiple belt-shaped organic light-emitting layers 42 are disposed on the transparent film 40 at positions crossing the positive electrode 41. Each of the organic light-emitting layers 42 has a laminated multilayer structure of a positive hole-transporting layer 42A, a light-emitting layer 42B, and an electron-transporting layer 42C formed in that order from the transparent film 40 side. A negative electrode 45 such as of aluminum is formed on the surface of the electron-transporting layer 42C. A positive hole-injecting layer may be inserted as needed additionally between the positive electrode 41 and the positive hole-transporting layer 42A. Alternatively, an electron-injecting layer may be inserted additionally between the negative electrode 45 and the electron-transporting layer 42C. The intersection of the positive electrode 41 with the organic light-emitting layer 42 functions as a pixel.

The configuration of the transparent film 41 to the negative electrode 45 is disclosed, for example, in JP-A No. 2003-272864.

The positive electrode 41, organic light-emitting layer 42, and negative electrode 45 are sealed, by bonding the flexible base material 50 to a transparent film 40 with an epoxy resin-based adhesive 48. The flexible base material 50 is the same as the flexible base material in any one of the first to eighth exemplary embodiments described above and bonded thereto with the surface having protrusions and depressions facing outside.

The light generated in the light-emitting layer 42B passes through the transparent film 40 and goes out. When the flexible image-displaying device is bent with the flexible base material 50 inside, the flexible base material 50 restricts the degree of curvature (deformation) and prevents breakdown of the organic EL element.

Alternatively in the tenth exemplary embodiment, protrusions and depressions may be formed on the external surface of the transparent film 40, similarly to the structure shown in FIG. 10C, to make the transparent film 40 play a role additionally as the flexible base material preventing bending. In such a case, the anti-deformation structure is formed on both faces of the organic EL element. As shown in FIG. 10D, a frame in the anti-deformation structure may also be attached to the organic EL element.

Hereinafter, the flexible image-displaying device in an eleventh exemplary embodiment will be described with reference to FIGS. 12A and 12B. In the flexible image-displaying device in the eleventh embodiment, the flexible base material in the first to eighth exemplary embodiment is applied to a flexible image-displaying plate, for example, to a liquid crystal display element.

Figure 12A:
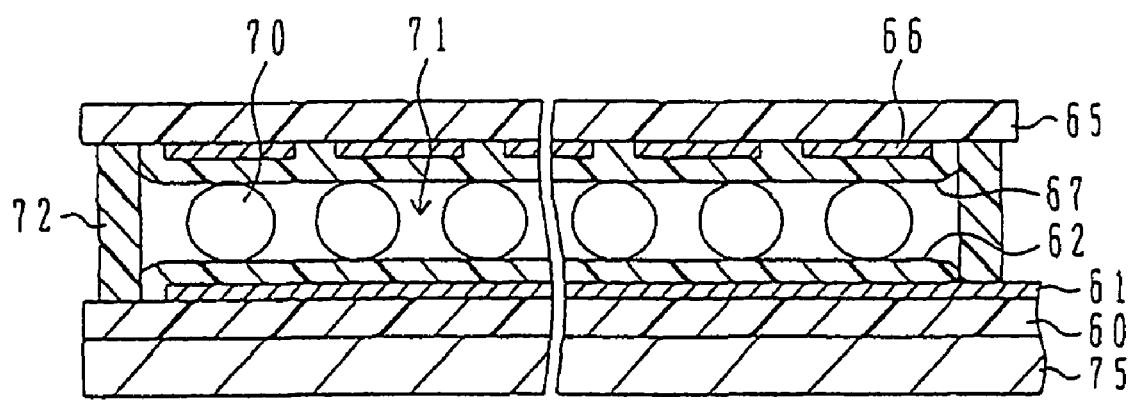
FIG. 12A is a sectional view illustrating the flexible image-displaying device in an exemplary eleventh embodiment in the region close to both terminals.
Figure 12B:
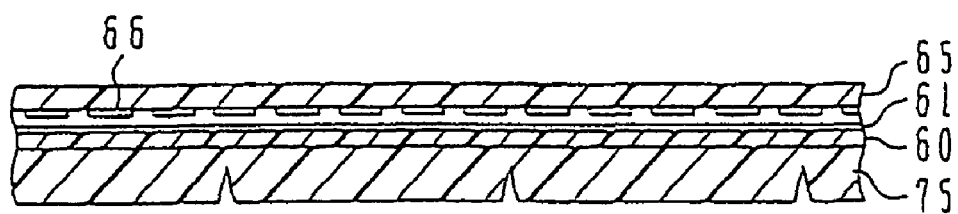
FIG. 12B is a sectional view illustrating a multiple-pixel region in the flexible image-displaying device of the eleventh exemplary embodiment.

FIG. 12A is a sectional view illustrating the regions at both terminals of the flexible image-displaying device in the eleventh exemplary embodiment, and FIG. 11B is a sectional view of the multiple-pixel region. A pair of flexible substrates 60 and 65 having a thickness of approximately 100 μm is disposed as separated by a certain distance. Transparent electrodes 61 and 66 for example of ITO are formed respectively on the internal surfaces of the substrates 60 and 65. The substrates 60 and 65 are generally, mainly made of PET, PC, PES, or the like, and have a structure laminated with a gas barrier layer, a surface-treated, and others. The transparent electrode 61 consists of multiple belt-shaped electrodes extending in the crosswise direction in the Figure, and the transparent electrode 66 has multiple belt-shaped electrodes extending in the direction perpendicular to the paper face in the Figure. Pixels are formed at the intersections of the electrodes. Oriented films 62 and 67 are formed respectively on the substrates 60 and 65, covering the transparent electrodes 61 and 66.

Gap-supporting members 70 and a nematic liquid crystal 71 are filled in the space between the two substrates 60 and 65. The substrates 60 and 65 are bonded with a sealant 72 by polymerization. A color filter or a polarized film is formed additionally as needed. Such a liquid crystal display element is disclosed, for example, in JP-A No. 9-101509.

A flexible base material 75 is bonded onto the external surface of one substrate 60. The flexible base material 75 is the same as the flexible base material in any one of the first to eighth exemplary embodiment described above. The surface having protrusions and depressions on the flexible base material 75 faces outward.

When the flexible base material 75 is bent with the flexible base material 75 inside, the flexible base material 75 restricts the degree of curvature, and thus, prevent breakdown of the liquid crystal display element.

Similarly to the structure shown in FIG. 10C, only one external surface of the substrate 60 may be made uneven surface in the eleventh exemplary embodiment, to make the substrate 60 have a structure also functioning as a flexible base material 75. Alternatively, an anti-deformation structure may be formed on both faces of the liquid crystal display element, similarly to the structure shown in FIG. 10D. Further alternatively, an additional frame for prevention of curvature of the liquid crystal display element may be attached, similarly to the structure shown in FIG. 10E.

In the flexible image-displaying devices in the ninth to eleventh exemplary embodiments, excessive deformation of an image-displaying plate such as paper-like display, organic EL element, or liquid crystal display element results in irreversible deterioration. The "irreversible deterioration" means deterioration prohibiting restoration of the display quality even when the image-displaying plate is repaired into its original shape. Examples of the irreversible deterioration include cracking of electrodes such as of ITO, whitening of the flexible film, and the like. Use of a shape in the anti-deformation structure in which adjacent protrusions come into contact with each other before generation of the deformation leading to irreversible deterioration is favorable as the three-dimensional shape of the anti-deformation structure.

The present invention has been described so far with reference to favorable exemplary embodiments, but the present invention is not limited thereby. For example, it is obvious for those skilled in the art that various modifications, improvements, combinations, and others of the invention are possible.

The invention claimed is:

1. A flexible base material, comprising:
    a flexible resin plate-shaped part and an anti-deformation structure formed on part or all of a surface of the plate-shaped part, wherein the anti-deformation structure includes protrusions and depressions on part or all of the surface of the plate-shaped part, and the protrusions and depressions are shaped such that adjacent protrusions come into contact with each other when the plate-shaped part is bent within a range of elastic deformation and restrict further deformation.

2. The flexible base material according to claim 1, wherein the anti-deformation structure has a structure wherein multiple members forming the protrusions are attached to at least one surface of the plate-shaped part.

3. The flexible base material according to claim 2, wherein the members forming the protrusions are made of a material having a higher rigidity than that of the plate-shaped part.

4. The flexible base material according to claim 2, wherein the protrusions have a three-dimensional shape selected from the group consisting of pyramid, pyramidal trapezoid, cone, conic trapezoid, and semi-sphere or semi-spheroid shapes.

5. The flexible base material according to claim 1, wherein the anti-deformation structure includes multiple depressions formed on at least one surface of the plate-shaped part.

6. The flexible base material according to claim 5, wherein the depressions comprise multiple grooves disposed in a direction parallel to a first direction.

7. The flexible base material according to claim 6, wherein the depressions comprise additional multiple grooves disposed in a direction parallel to a second direction that is perpendicular to the first direction.

8. A flexible image-displaying device, comprising:
    an image-displaying plate having multiple pixels formed on the surface of a flexible film, and a flexible base material attached to the image-displaying plate that deforms together with the image-displaying plate, wherein the flexible base material further comprises a flexible resin plate-shaped part and an anti-deformation structure formed on part or all of a surface of the plate-shaped part, the anti-deformation structure includes protrusions and depressions formed on part or all of the surface of the plate-shaped part, and the protrusions and depressions are shaped such that adjacent protrusions come into contact with each other when the plate-shaped part is bent and restrict further deformation.

9. The flexible image-displaying device according to claim 8, wherein the adjacent protrusions in the anti-deformation structure come into contact with each other in a state when the plate-shaped part is deformed within a range of elastic deformation.

10. The flexible image-displaying device according to claim 8, wherein the adjacent protrusions in the anti-deformation structure come into contact with each other before the image-displaying plate is deformed to a degree causing irreversible deterioration.

11. The flexible image-displaying device according to claim 8, wherein the flexible base material doubles as the flexible film constituting the display image plate.

12. The flexible image-displaying device according to claim 8, wherein multiple pixels are disposed on one of the protrusions or in one of the depressions of the anti-deformation structure.

13. The flexible image-displaying device according to claim 8, wherein the image-displaying plate comprises an image-displaying region displaying an image and a frame region surrounding the image-displaying region, and the flexible base material is disposed at a region including the image-displaying region.

14. The flexible image-displaying device according to claim 8, wherein the image-displaying plate further comprises an image-displaying region in which pixels are distributed and a frame region surrounding the image-displaying region, and the flexible base material is disposed so as to overlap the frame region but not the image-displaying region.

15. The flexible image-displaying device according to claim 8, wherein the image-displaying plate is a paper-like display, an organic EL element, or a liquid crystal display element.

* * * * *